(12) United States Patent
Milor et al.

(10) Patent No.: US 10,303,541 B2
(45) Date of Patent: May 28, 2019

(54) TECHNOLOGIES FOR ESTIMATING REMAINING LIFE OF INTEGRATED CIRCUITS USING ON-CHIP MEMORY

(71) Applicant: Georgia Tech Research Corporation, Atlanta, GA (US)

(72) Inventors: Linda Milor, Atlanta, GA (US); Woongrae Kim, Atlanta, GA (US); Taizhi Liu, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 119 days.

(21) Appl. No.: 15/446,776

(22) Filed: Mar. 1, 2017

(65) Prior Publication Data
US 2017/0255507 A1 Sep. 7, 2017

Related U.S. Application Data

(60) Provisional application No. 62/301,652, filed on Mar. 1, 2016.

(51) Int. Cl.
| | |
|---|---|
| *G06F 11/07* | (2006.01) |
| *G06F 17/50* | (2006.01) |
| *G11C 29/02* | (2006.01) |
| *G11C 29/12* | (2006.01) |
| *G11C 29/24* | (2006.01) |
| *G11C 29/50* | (2006.01) |
| *G11C 29/00* | (2006.01) |
| *G11C 29/36* | (2006.01) |

(52) U.S. Cl.
CPC .......... *G06F 11/079* (2013.01); *G06F 11/073* (2013.01); *G06F 17/5022* (2013.01); *G06F 17/5036* (2013.01); *G11C 29/02* (2013.01); *G11C 29/12005* (2013.01); *G11C 29/24* (2013.01); *G11C 29/50004* (2013.01); *G11C 29/50016* (2013.01); *G11C 29/70* (2013.01); *G11C 2029/1208* (2013.01); *G11C 2029/3602* (2013.01); *G11C 2029/5002* (2013.01); *G11C 2029/5004* (2013.01); *G11C 2029/5006* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0078741 A1* | 4/2003 | Storino | .................. | G06Q 30/02 702/34 |
| 2009/0154242 A1* | 6/2009 | Janai | ..................... | G11C 29/70 365/185.09 |

(Continued)

*Primary Examiner* — Charles Ehne
(74) *Attorney, Agent, or Firm* — Troutman Sanders LLP; Ryan A. Schneider; Ginger G. Turner

(57) ABSTRACT

Methods and systems have been proposed to estimate the remaining lifetime of an electronic integrated circuit that incorporates error-correcting code memory by using the failed memory bits as an indicator for the remaining lifetime of the circuit. The number of failed memory bits correlates with the remaining lifetime of the circuit, but varies as a function of wearout mechanism and use conditions. The methodology incorporates algorithms and test patterns to diagnose the cause of memory cell failure. By linking the failed bits to the wearout mechanism and by using lifetime simulation, the remaining lifetime of the circuit is estimated.

23 Claims, 12 Drawing Sheets

(56) References Cited

U.S. PATENT DOCUMENTS

| | | | |
|---|---|---|---|
| 2013/0124116 A1* | 5/2013 | Du | G05B 23/0283 702/58 |
| 2014/0380106 A1* | 12/2014 | Presman | G06F 11/073 714/718 |
| 2017/0160338 A1* | 6/2017 | Connor | G11C 7/00 |

* cited by examiner

TECHNOLOGIES FOR ESTIMATING REMAINING LIFE OF INTEGRATED CIRCUITS USING ON-CHIP MEMORY

PRIORITY CLAIM

This application claims benefit under 35 U.S.C. § 119(e) of U.S. Provisional Patent Application No. 62/301,652, filed Mar. 1, 2016 and entitled "Semiconductor Memory Systems and Methods," which is incorporated herein by reference as if set forth herein in its entirety.

STATEMENT AS TO RIGHTS UNDER FEDERALLY SPONSORED RESEARCH

The disclosed subject matter was made with government support under DARPA grant No. HR0011-11-1-0011 awarded by the Department of Defense. The government has certain rights to the invention.

TECHNICAL FIELD

Generally, the present disclosure relates to reliability of electronic circuits. More particularly, the present disclosure relates to technologies for estimating the remaining lifetime of electronic integrated circuits.

BACKGROUND

Semiconductor integrated circuit process technology scaling has involved the reduction of interconnect and transistor dimensions without reducing the supply voltage in proportion. Hence, wearout of transistor devices and interconnects is occurring more quickly than with previous technology generations. At the same time, there is a desire to use commercial electronics in applications that require reliability over a longer lifetime or under unique stress conditions (e.g. aerospace, automotive, military, etc.). In these applications, it is desirable to use commercial electronic components while still meeting reliability requirements of the application. Safety critical applications (e.g. aviation, automobiles, and healthcare) require that electronic components be monitored periodically so that components that are likely to fail in the near future are replaced to avoid catastrophic failures in the field. One way to ensure safe operations is to estimate the remaining life of critical electronic components, including integrated circuits such as a system on a chip (SoC), microprocessor, microcontroller, etc.

In the related art, attempts to dynamically estimate the remaining lifetime of an integrated circuit have focused on operating parameters, such as temperature, voltage, and operating frequency. In the related art, the operating parameters are monitored using embedded sensors, such as temperature sensors, current sensors, voltage sensors, and delay sensors. These embedded sensors require additional components and circuitry; meaning additional physical space and electrical power is required to implement these solutions. These sensors do not have the capability to diagnose failure mechanisms within the integrated circuit.

Because wearout of electronic circuits is occurring more quickly than with previous technology generations in addition to a continued desire to reduce power consumption, size, and cost of electronic circuits, there is a need for more effective technologies for detecting failures in electrical circuitry, diagnosing failures in electrical circuitry, and estimating future lifetimes of electronic circuitry.

SUMMARY

Briefly described, and according to one embodiment, aspects of the present disclosure generally relate to systems and methods for estimating the remaining lifetime of an electronic integrated circuit where the integrated circuit includes a circuit block containing redundant circuitry such as an on-chip cache.

According to an example embodiment a method is provided for estimating the remaining lifetime of an electronic integrated circuit for example, a system on a chip (SoC), a microprocessor, or a microcontroller, where the integrated circuit includes on-chip memory, for example random access memory (RAM). This method involves performing a diagnostic on failed memory cells wherein data is generated related to a bit failure event; using data generated during each diagnostic to estimate the future lifetime performance of the integrated circuit. In one embodiment of the method, time to failure within the memory and time to failure within the integrated circuit are modeled separately with statistical distributions, for example Weibull distributions and/or Log-normal distributions. In this embodiment, diagnostic data generated related to a bit failure event is used to generate one or more statistical distributions associated with the memory, and a map is used to generate statistical distributions for the integrated circuit that are based on the memory statistical distributions. These integrated circuit statistical distributions are then used to estimate the future lifetime performance of the integrated circuit.

According to another example embodiment, the disclosed method is for estimating the remaining lifetime of an integrated circuit, where the integrated circuit includes circuit blocks comprising redundant circuitry. This method involves detecting faults in the circuit blocks comprising redundant circuitry and classifying the fault into one or more wearout mechanisms. Considerations such as use conditions, wearout mechanisms, and feasible fault locations may be utilized to generate statistical models of the memory and the integrated circuit. In one embodiment, the method considers one or more wearout mechanisms that may include: backend dielectric breakdown (BTDDB), gate oxide breakdown (GOBD), electromigration (EM), stress-induced voiding (SIV), bias temperature instability (BTI), hot carrier injection (HCI), time-dependent gate oxide breakdown (GTDDB), and middle-of-line time-dependent dielectric breakdown (MTDDB) and categorizes each fault according to the wearout mechanism. In one embodiment, the method considers use conditions such as corporate, gaming, office work, or general usage. The remaining lifetime of the circuit blocks comprising redundant circuitry and the integrated circuit may be estimated based on the physical models associated with the wearout mechanisms, the use conditions, the fault locations, additional factors, or some combination thereof.

In one embodiment, the electronic system to determine the remaining lifetime of an integrated circuit including memory comprises a customized controller, a test pattern generator, and an output response analyzer. Embodiments of the disclosed electronic system may use one or more strategies to determine the location of the fault. The electronic system may use one or more strategies for classifying the fault into a wearout mechanism. Certain implementations of the disclosed electronic system include built-in self test circuitry (BIST) that is capable of collecting bit rate failure data from the memory, with the additional capability of using that data to predict future life performance of the integrated circuit. Some embodiments of the electronic system are capable of communicating with multiple memory architectures on an integrated circuit having different cache sizes and operating frequencies. In this embodiment, the electronic system need not be redesigned for each integrated circuit; the electronic system can be reconfigured to perform the disclosed methodology within integrated circuits having different process technologies, different cache sizes, and different memory architectures.

In one embodiment, the disclosed method is for updating a physical model of a wearout mechanism. Considering a circuit block containing redundant circuitry, when a fault occurs, the fault may be detected and classified into a wearout mechanism. Determination of the wearout mechanism may be accomplished by providing electrical signals to the circuit block containing redundant circuitry and monitoring electrical test points within the redundant circuitry. Once the wearout mechanism for the fault is determined, the wearout mechanism and the time to failure of the fault can be recoded. The physical model of the wearout mechanism may be updated based on the time to failure of the fault. This method may be repeated and the collection of recorded data may be used to update physical models of each classified wearout mechanism. In some implementations, the embodiment may be used to estimate the remaining lifetime of a circuit block on an integrated circuit other than the integrated circuit containing the circuit block with the recorded faults.

Hence, in summary, the failure rate of faults within redundant circuitry is tracked using the disclosed methodology and electronic system to diagnose and classify failures. Wearout model parameters may be estimated for all critical wearout mechanisms. Physical models of the memory and the integrated circuit together with the failure rate data of the redundant circuitry is then used to estimate the remaining life of the integrated circuit.

BRIEF DESCRIPTION OF THE DRAWINGS

The accompanying drawings illustrate example embodiments of the present disclosure. Such drawings are not to be construed as necessarily limiting the disclosure. Like numbers and/or similar numbering scheme can refer to like and/or similar elements throughout.

DETAILED DESCRIPTION

The present disclosure will now be described more fully with reference to the accompanying drawings, in which example embodiments of the disclosure are shown. The disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

According to the International Technology Roadmap for Semiconductors, high performance processors will contain 82% memory, while consumer system-on-chips will consist of 86% memory, on average. Memory systems are potentially less vulnerable to wearout compared to logic circuits, because memory circuits may have redundant resources or use error-correcting codes (ECCs). As one of ordinary skill in the art understands, the memory will therefore continue to operate after internal circuits have failed. These failed circuits can be used as indicators as to the likely failure rate of the entire integrated circuit.

Because of the abundance of memory on integrated circuits and the significant numbers of faults that may occur in the memory (bit failures) prior to complete failure of the entire circuit, faults in on-chip caches are readily available to be diagnosed for the purpose of predicting the time to failure of the integrated circuit. However, the embodiments described in this disclosure are not limited to the diagnosis of memory systems, and diagnosis of other circuit blocks containing redundant circuitry may also be used for the purpose of predicting the time to failure of the integrated circuit. For example, redundant logic circuits may generate output data that could be monitored with error correcting codes that may be used to identify the failing circuit block, and that circuit block could then be diagnosed.

One challenge in using faults occurring in redundant circuitry to predict the remaining lifetime of the integrated circuit is that circuit blocks containing redundant circuitry and logic blocks may fail at different rates. Therefore a correlation or mapping must be created to link faults in the redundant circuit to the time to failure of the integrated circuit. Methods that take into consideration use conditions or wearout mechanisms may more accurately predict future performance of the integrated circuit.

Methods disclosed here may be applied not only during field operation, but also during accelerated life testing.

Figure 1:
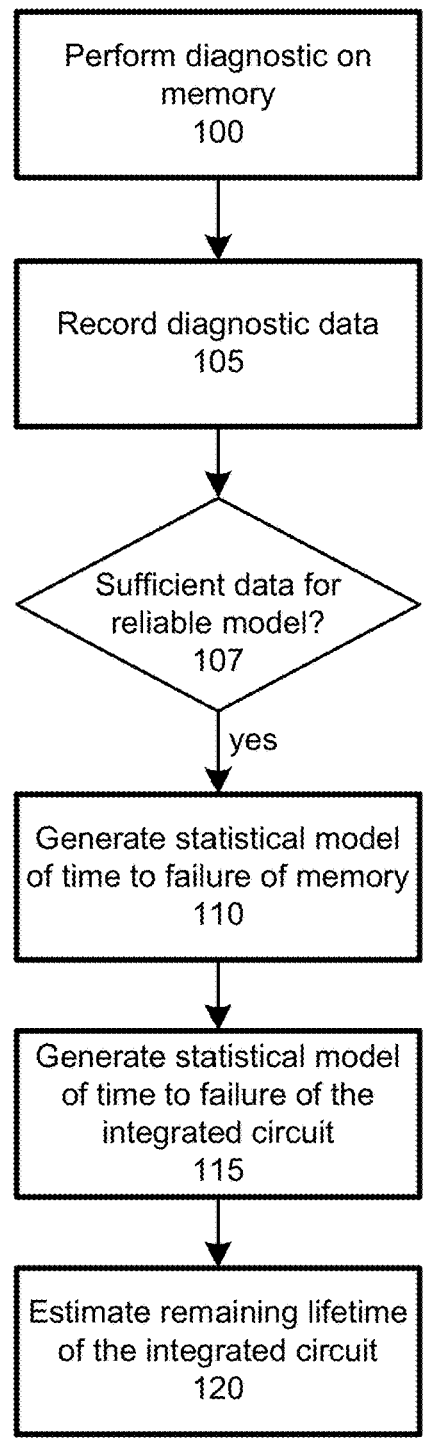
FIGS. 1, 2, and 3A are flowcharts of example embodiments of a method for estimating the remaining lifetime of an integrated circuit.

Referring to the figures, FIG. 1 is a flowchart for one example embodiment of the method. The method begins by performing a diagnostic on the memory 100. The diagnostic 100 captures data related to faults in the memory, and data from the diagnostic is recorded 105. In some implementations, if sufficient data is recorded to create a reliable statistical model 107, the recorded data is used to generate a statistical model of time to failure of the memory 110. In some implementations, the diagnostic could capture data related to the number of bit failures, time between bit failures, and/or cause of bit failures, for example. The statistical model of the time to failure of the memory 110 can be used to generate a statistical model of time to failure of the integrated circuit 115. For example, a correlation between a failure rate of the logic and a failure rate of the memory within the integrated circuit can be used to generate the statistical model of time to failure of the integrated circuit 115 from the statistical model of the time to failure of the memory 110. In one embodiment, the correlation may be based on simulation or testing of the integrated circuit performed prior to the integrated circuit being placed into operation. In other embodiments, the diagnostic data itself may be used as an input to generating the correlation. The statistical model of the time to failure of the integrated circuit can be used to estimate the remaining lifetime of the integrated circuit 120.

This method may be performed many times during the life of the integrated circuit. In one embodiment, the method may begin following detection of a fault in the memory (e.g. a bit failure event). In another embodiment, the method may begin at various time intervals. Each time the method is executed, additional data may be recorded 105 and the collection of the recorded data may be utilized to generate statistical models 110, 115.

Although the embodiment described above involves estimating a remaining lifetime of a circuit based on a bit failure in memory, this is merely an example and faults in other portions of an integrated circuit may be detected and diagnosed to estimate a remaining life of an integrated circuit.

Figure 2:
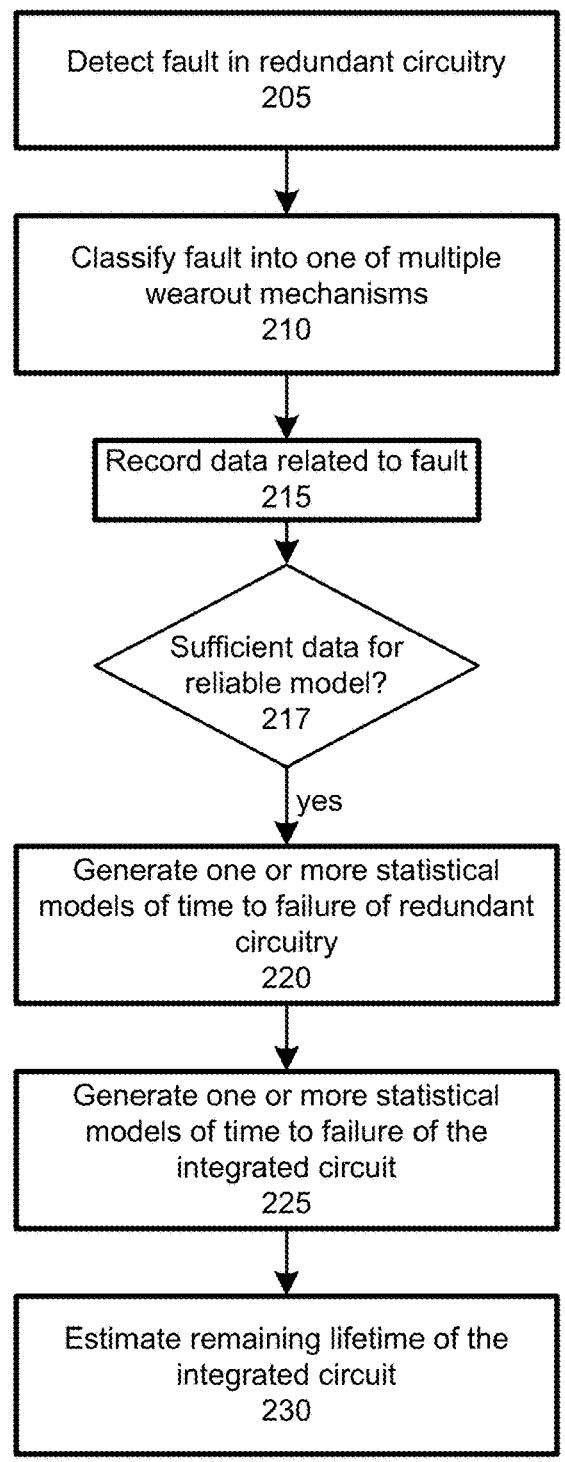

FIG. 2 is a flowchart for one example embodiment of the method. This method includes detecting a fault in circuit blocks comprising redundant circuitry 205, and classifying the fault into a wearout mechanism 210. Detecting and classifying the fault may be accomplished by communicating electrical signals to the redundant circuitry, monitoring test points, or both. For example, if an embodiment of the disclosed electronic system is in communication with a circuit block comprising redundant circuitry, the electronic system may send out an electrical signal that may produce a certain voltage, current, data, or other output at a test point that would indicate that a fault had occurred in the circuit block. In some implementations, the fault may be classified as backend dielectric breakdown (BTDDB), gate oxide breakdown (GOBD), electromigration (EM), stress-induced voiding (SIV), hot carrier injection (HCI), time-dependent gate oxide breakdown (GTDDB), middle-of-line time-dependent dielectric breakdown (MTDDB), negative bias temperature instability (NBTI), or positive bias temperature instability (PBTI), for example. Data related to each fault is recorded 215. In some implementations, the data may include the classified wearout mechanisms, the number of faults, time between faults, locations of faults, and/or causes of faults, for example. If sufficient data has been recorded to generate a reliable statistical model of the circuit blocks comprising redundant circuitry 217, recorded data may be used to update one or more statistical models of time to failure of the redundant circuitry 220. The one or more statistical models of the time to failure of the redundant circuitry 220 can be used to update a statistical model of time to failure of the integrated circuit for the classified wearout mechanism 225. In some implementations, the failure rate of the integrated circuit may be characterized by multiple statistical models due to multiple wearout mechanisms. The remaining lifetime of the integrated circuit may be estimated by combining statistical models associated with the integrated circuit 230. This method may be performed many times during the life of the integrated circuit. Each time the method is executed, additional data may be recorded 215 and the collection of the recorded data may be utilized to generate statistical models 220, 225.

To illustrate with a specific example, if a fault is classified as GOBD 210, and a sufficient number of faults classified as GOBD have occurred 217, a statistical model of time to failure of circuit blocks comprising redundant circuitry due to GOBD may be generated or updated 220. An inverse map correlating expected GOBD failure rates in the integrated circuit with expected GOBD failure rates in the redundant circuitry could be used to update the statistical model of time to failure of the integrated circuit due to GOBD 225. Finally, statistical models of time to failure of the integrated circuit for multiple wearout mechanisms such as GOBD, BTDDB, EM, SIV, etc. could be combined to estimate the remaining lifetime of the integrated circuit 230.

Figure 3:
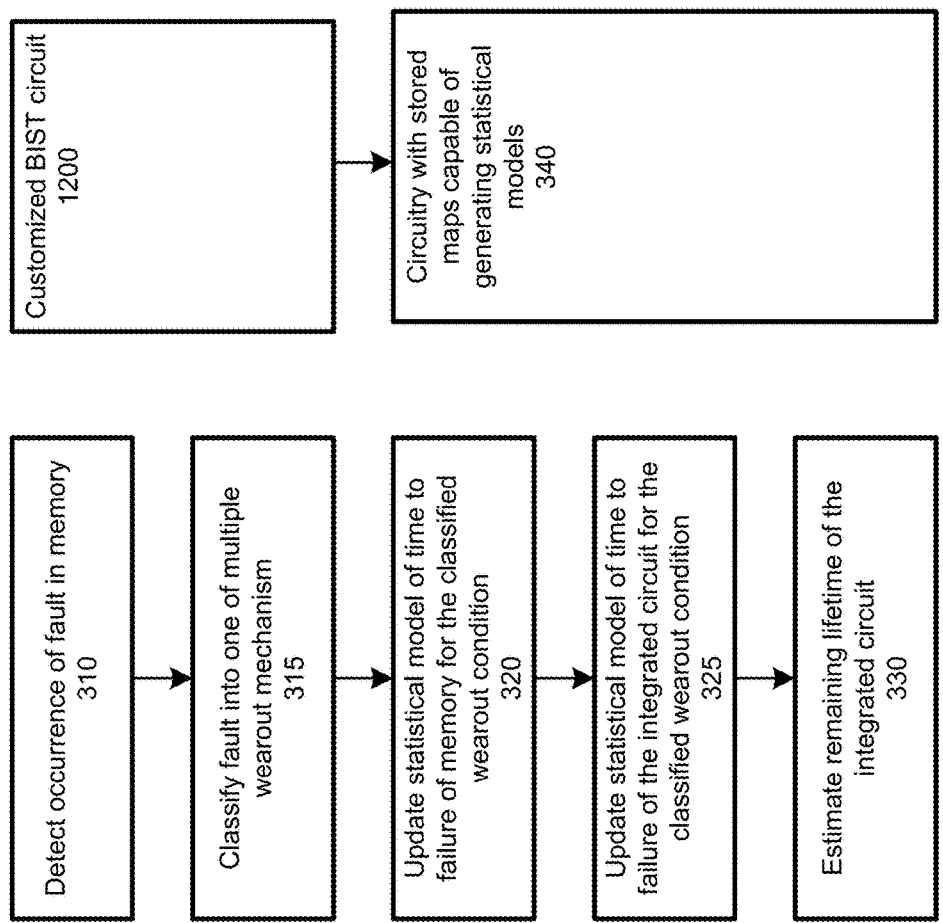
FIG. 3B is a flow chart depicting modules that may be capable of implementing the method according to some embodiments.

FIG. 3A is a flowchart for one example embodiment of the method. FIG. 3B is a flow chart depicting modules that may be capable of implementing the method depicted in FIG. 3A. The method begins by detecting the occurrence of a fault in memory 310. The fault is classified into a wearout mechanism 315. Fault detection 310 and fault classification 315 may be carried out by a customized BIST circuit 1200, like the one depicted in FIG. 11 for example. The customized BIST 1200 may also retain data related to faults that have been previously detected and may retain data related to time between failures. This data can be provided to additional circuitry 340 that has the capability to generate or update statistical models of time to failure of the memory 320, update statistical models of time to failure of the integrated circuit 325, and estimate the remaining lifetime of the integrated circuit 330. In one implementation, the additional circuitry 340 has mapping functions stored for generating or updating the statistical models for time to failure of the integrated circuit 325 based on the statistical models of time to failure of the memory 320.

The present disclosure should not be considered limited to wearout mechanisms disclosed herein, and one of ordinary skill would understand that, in some embodiments, additional wearout mechanisms will be considered, or certain implementation may not utilize all wearout mechanisms.

Some wearout mechanisms such as GOBD, BTDDB, EM, and SIV result in open or short faults. These wearout mechanisms cause abrupt failures. Hence it is sufficient to model the time-to-failure due to these wearout mechanisms and combine them statistically. Bias temperature instability and hot carrier injection, on the other hand, cause gradual weakening of devices. The weakening is both random and a function of stress and temperature. In this case, the relationship between degradation and the circuit performances must be taken into account to determine the lifetime distribution.

During the design and testing phase of the integrated circuit, the integrated circuit can be analyzed to determine potential fault locations and failure modes. For example, statistical models of time to failure may be specific to a region of the integrated circuit (e.g. memory vs. logic, or divided based on functionality, temperature, voltage, etc.), and for each region statistical models of time to failure may be specific to a wearout mechanism, a use condition, or some other condition or mechanism. From here, maps may be created to correlate the statistical models of one circuit region to another circuit region.

Each wearout mechanism is characterized by device physics, representing state of the art knowledge of the physics of failure due to each wearout mechanism. The following paragraphs describe example physical models for the purpose of illustration, and are not meant to be limiting. Additional or different wearout mechanisms may be considered, and examples described below may be modeled differently in other embodiments.

Backend dielectric breakdown (BTDDB) is due to the buildup of traps in the dielectric due to stress. The result of wearout is resistive short faults. The time-to-fail for BTDDB may be modeled with a Weibull distribution. The characteristic lifetime, $\eta_{BTDDB}$, is a function of the gate oxide surface area, the vulnerable length of the dielectric segment, $L_{BTDDB}$, its associated line space, $S_{GTDDB}$, the corresponding electric field, $E=V/S_{BTDDB}$, where V is the supply voltage, the Weibull shape parameter, $\beta_{BTDDB}$, the field acceleration factor, $\gamma$, the activation energy, $E_a$, Boltzmann's constant, $k_B$, the probability that the adjacent nets to the dielectric segment are at opposite voltages, $\alpha_{GTDDB}$, and the fitting parameters, $A_{BTDDB}$ and M, as follows:

$$\eta_{BTDDB} = A_{BTDDB} \frac{L_{BTDDB}}{\alpha_{BTDDB}} e^{-\frac{1}{\beta_{BTDDB}}} \exp\left(-\gamma E^M - \frac{E_a}{k_B T}\right). \quad \text{(Equation 1)}$$

Electromigration (EM) occurs when electrical current transfers momentum to ions in the metallic lattice causing some of the metallic ions to be transferred to the adjacent material. EM leads to the reduction of via/contact dimensions and an increase in resistance. Over time, electromigration results in open faults. Electromigration may be modeled with a characteristic lifetime, $\eta_{EM}$ $$\eta_{EM} = A_{EM} T/j_{EM} \quad \text{(Equation 2)}$$

which depends on temperature, T, the current density, $j_{EM}$ and $A_{EM}$, a technology dependent constant. The rate of increase in via/contact resistance is a function of the average current density flowing through a via/contact.

Stress-induced voiding (SIV) occurs when directionally biased motion of atoms is induced by thermal mechanical stress between the metal and the dielectric at high temperatures. SIV leads to an increased in via/contact resistance and eventually voiding. The resistance of a via/contact depends on the line width above the via/contact and the difference between the operating temperature and the stress-free temperature of the materials. The characteristic lifetime, $\eta_{SIV}$ of a via/contact due to SIV may be modeled as:

$$\eta_{SIV} = A_{SIV} W_{SIV}^{-M} (T_0 - T)^{-N} \exp(E_a/kT) \quad \text{(Equation 3)}$$

which is a function of the line width, $W_{SIV}$, the geometry stress component, M, the stress-free temperature, $T_0$, the thermal stress component, N, the activation energy, $E_a$, and a constant, $A_{SIV}$.

Gate oxide breakdown (GOBD) results in stress induced leakage current caused by trap-assisted tunneling, where electrons pass through the oxide via defect sites (traps). Over time, gate oxide breakdown results in resistive short faults. The characteristic lifetime, $\eta_{GOBD}$, may be expressed as a function of the total gate oxide surface area, temperature, and gate voltage due to the weakest-link character of oxide breakdown as follows:

$$\eta_{GOBD} = \quad \text{(Equation 4)}$$
$$A_{GOBD}\left(\frac{1}{WL}\right)^{\frac{1}{\beta_{GOBD}}} \exp\left(-\frac{1}{\beta_{GOBD}}\right) \frac{V^{a+bT}}{\alpha_{GOBD}} \exp\left(\frac{c}{T} + \frac{d}{T^2}\right)$$

where W and L are the device width and length, respectively, $\beta_{GOBD}$ is the Weibull shape parameter, $\alpha_{GOBD}$ is the fraction of time that the gate is under stress, T is temperature, V is the gate voltage, and a, b, c, d, and $A_{GOBD}$ are fitting parameters.

Negative bias temperature instability (NBTI) is induced by the presence of traps in the oxide and leads to an increase in the threshold voltage of PMOS devices when the devices are under stress. Positive bias temperature instability (PBTI) is the similar mechanism that impacts the NMOS devices.

NBTI and PBTI result in shifts in threshold voltages and other device characteristics, which is in addition to random variation in device threshold voltages from one device to another at different locations on the integrated circuit. The initial distribution of threshold voltages for all devices in a circuit is assumed to be a Gaussian distribution. The shift in threshold voltage as a function of time due to NBTI and PBTI may be modeled with trapping/de-trapping theory. Trapping/de-trapping theory involves a Poisson distribution of the number of available defects, a Binomial distribution of the number of occupied traps based on an occupancy probability, an occupancy probability that is a function of emission and capture time constants, and emission and capture time constants that have a random distribution that depends on bias and temperature.

Overall, the shift in threshold voltage, $\Delta V_{th}$ is a function of the time under stress, t, $$\Delta V_{th} = \varphi(T, E_F)(A + B \ln(t)) \quad \text{(Equation 5)}$$

where $\varphi(T, E_F)$ is a function that depends on the trap energy density distribution and the band-gap, T is temperature, $E_F$ is the Fermi level, and A and B are fitting constants. $\varphi(T, E_F)$ relates to the temperature, time under stress, time under recovery, duty cycle, and bias voltage.

Figure 4:
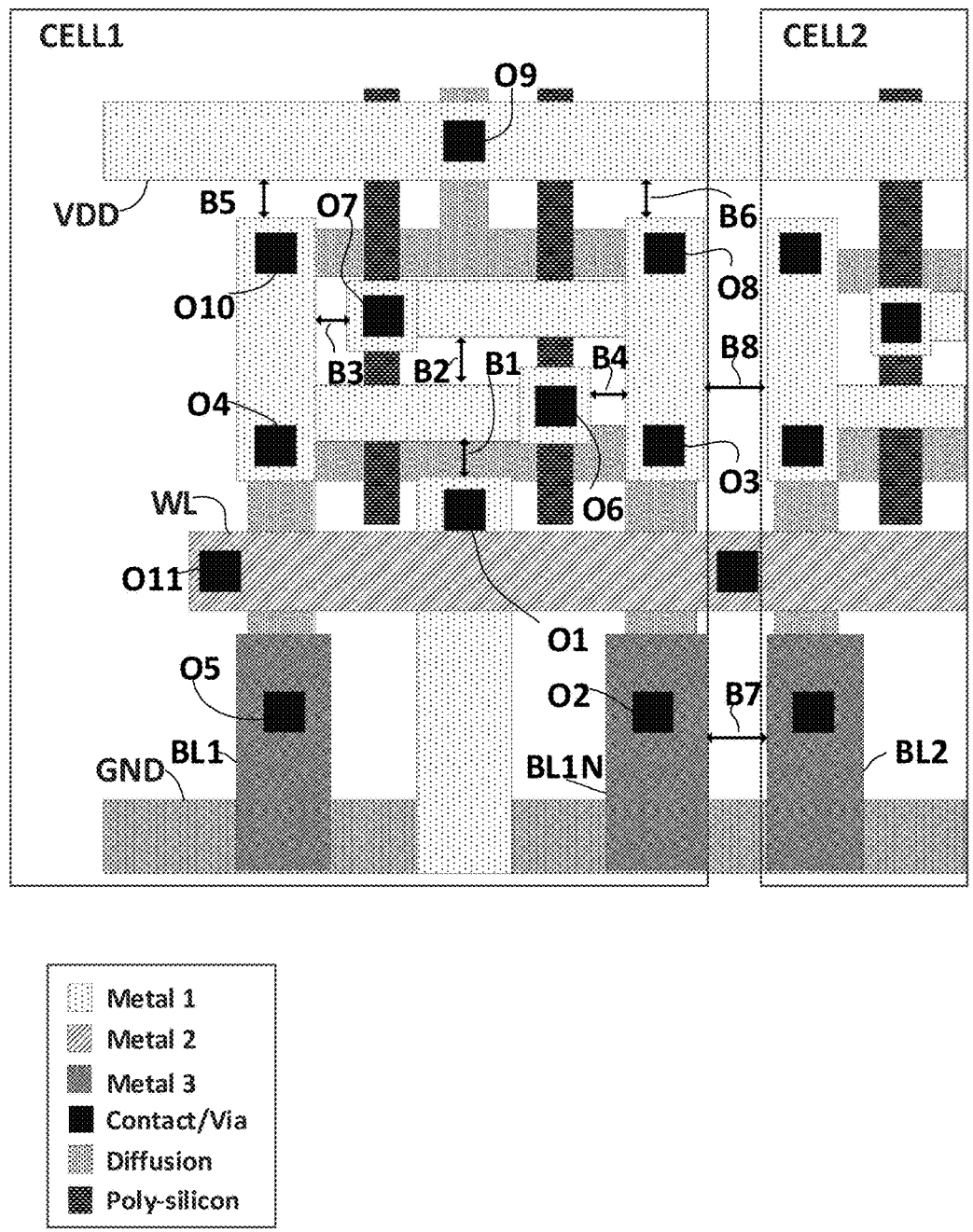
FIG. 4 shows backend wearout locations in a physical layout of an example SRAM cell according to an implementation of an example embodiment.

FIG. 4 shows an example layout of an SRAM cell for the purposes of illustrating an implementation of an example embodiment of the disclosed method and system. This layout includes six fabrication layers: Contact/Via, Diffusion, Poly-silicon, Metal 1, Metal 2, and Metal 3. This layout includes a power connection, labeled VDD, a ground connection, labeled GND, a wordline connection labeled WL, and a pair of upper and lower bitline connections labeled BL1 and BL1N. The upper bitline for CELL2 is labeled BL2. A complete cell for the purposes of modeling is enclosed in the CELL1 box. An SRAM is composed of many copies of this cell structure. A partial cell, enclosed in the CELL2 box is included to show potential fault locations in between cells. Potential fault locations due to backend wearout parameters are identified in this example with the labels B1 through B8. Potential fault locations due to via/contact voiding due to EM or SIV are identified in this example with labels O1 through O11. In an example embodiment, potential fault locations B1 through B8 and O1 through O11 are considered when diagnosing a failed SRAM cell. As would be understood, an SRAM cell having a different layout may be modeled with different potential fault locations than those shown in FIG. 4, and in general, modeling of an SRAM cell isn't limited to the wearout mechanisms described in this implementation.

Figure 5:
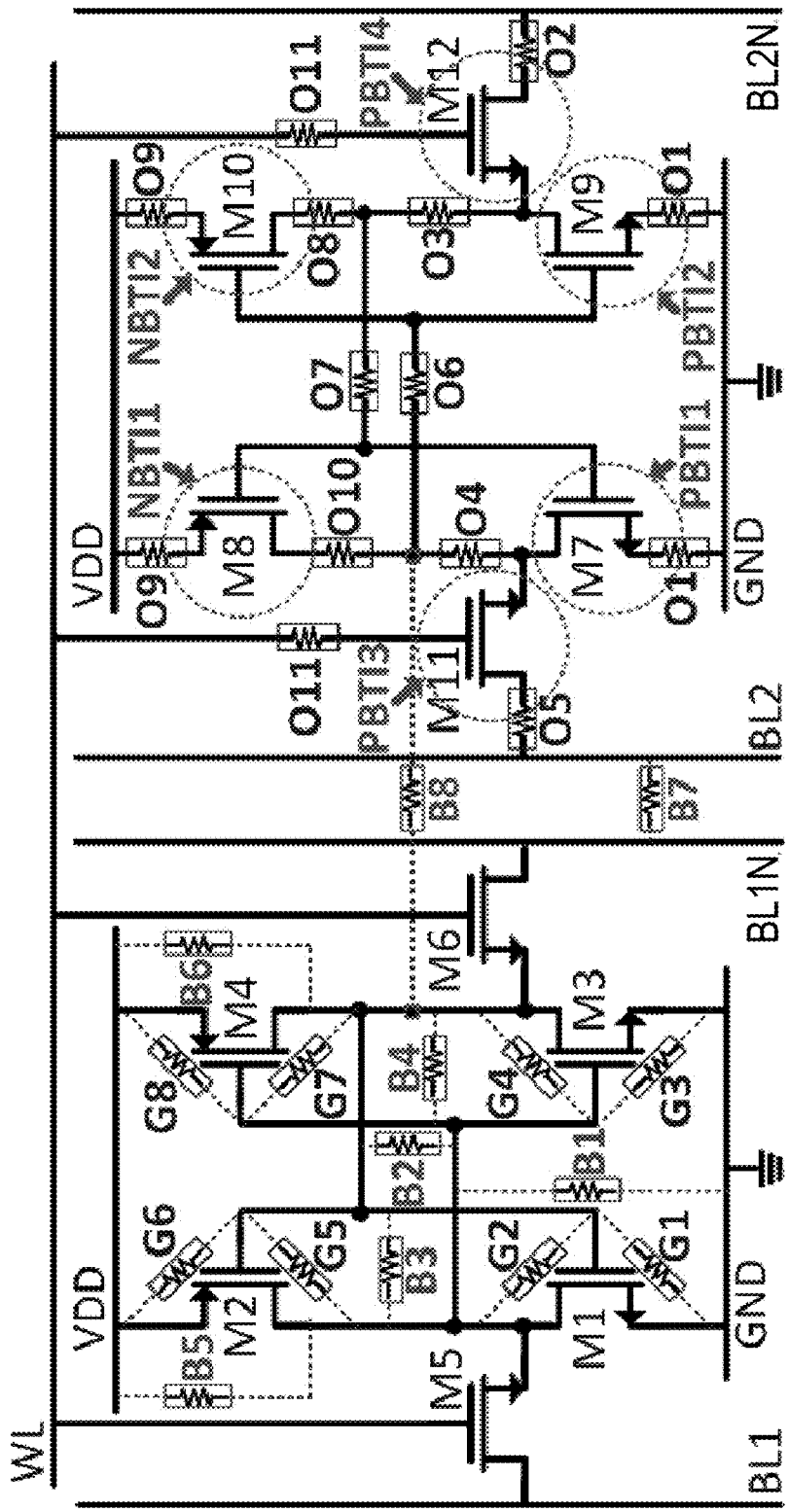
FIG. 5 shows fault modeling of wearout mechanisms according to an implementation of an example embodiment.

FIG. 5 shows an electrical schematic of two SRAM cells (a first and a second cell) where those cells have the layout shown in FIG. 4 for the purpose of further illustrating the implementation of the example embodiment. The electrical schematic of FIG. 5 includes twelve transistors labeled M1 through M12, a power connection, labeled VDD, a ground connection, labeled GND, a wordline connection labeled WL, paired bitline connections for the first cell labeled BL1 and BL1N, and paired bitline connections for the second cell, labeled BL2 and BL2N. FIG. 5 shows locations B1 through B8 and O1 through O11 at their corresponding location on the electrical schematic for the cell layout shown in FIG. 4. In addition to the backend fault locations corresponding to FIG. 4, FIG. 5 also shows the frontend wearout locations, namely those due to GOBD, labeled G1 through G8, NBTI, labeled NBTI1 and NBTI2, and PBTI, labeled PBTI1 through PBTI4. Transistors M5 and M6 are turned off for a larger percentage of time compared to the other transistors shown in FIG. 5. Hence it is unlikely to observe failures due to wearout at these transistors. As would be understood, an SRAM cell having a different layout may be modeled with different fault locations than those shown in FIG. 5, and in general, modeling of an SRAM cell isn't limited to the wearout mechanisms described in this implementation.

Figure 11:
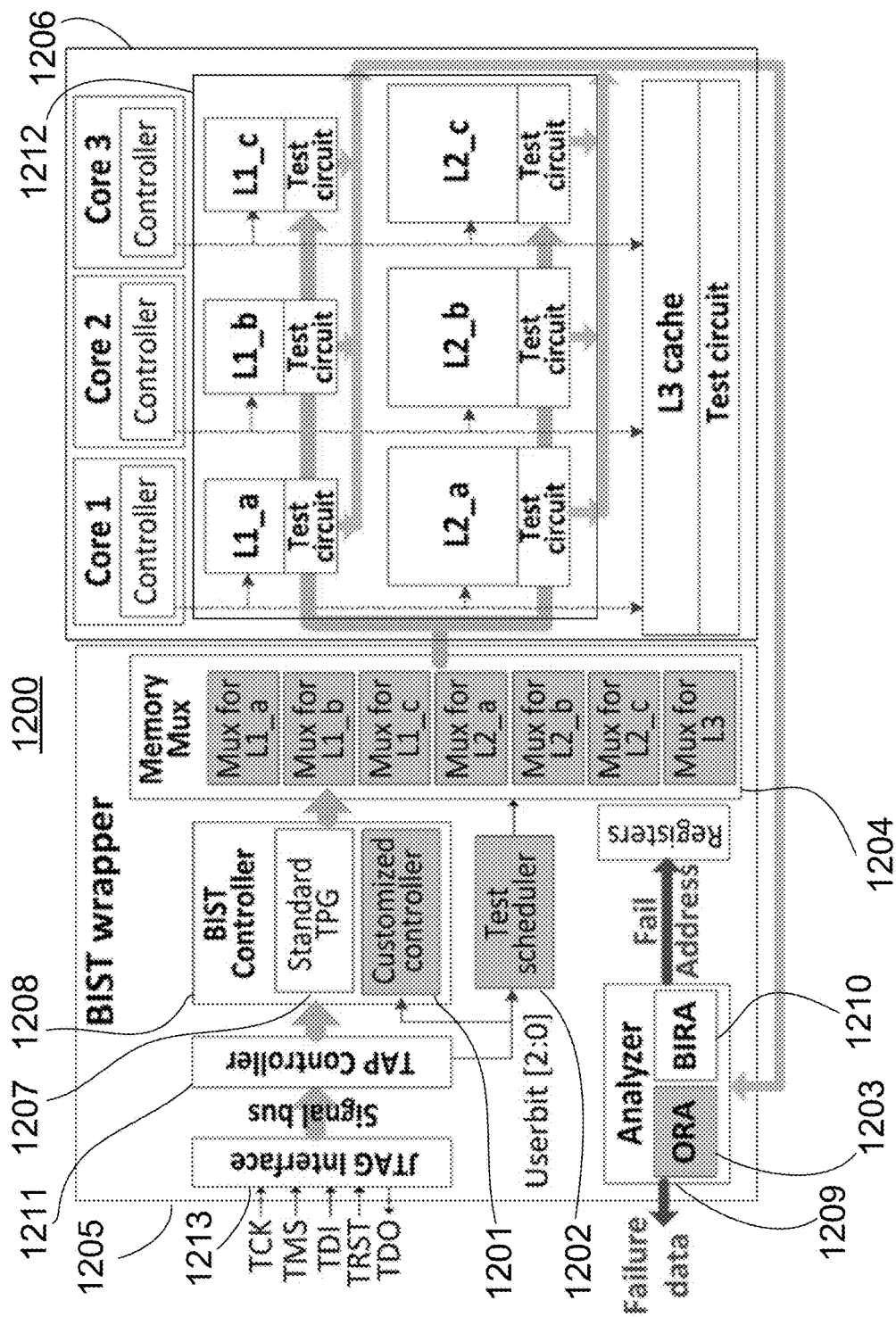
FIG. 11 shows a portion of an example embodiment of the electronic system.

To further illustrate the implementation using an example embodiment, the electronic system may include a built-in self test (BIST) system that utilizes an algorithm to detect and classify all SRAM faults (bit failures) to one or more of the wearout mechanisms that are illustrated in FIG. 4 and FIG. 5. The BIST system may include a BIST controller 1201, test pattern generator 1202, and output response analyzer 1203 (as shown in FIG. 11 and described in greater detail later in this disclosure). The system may utilize various techniques to detect worn out cells such as analysis of bitline current using a paired comparison between cells in the upper and lower bank in the same sector of each memory or through error-correcting code data, for example. The aforementioned paired comparison controls for a length mismatch between a cell being testing and the sense amps used to read the values transmitted to the bitlines due to variations in the bitline parasitics. Identification of faulty cells may be followed by a sequential diagnosis of each of the potential fault locations, with the test patterns specified in Table I. The sequential diagnosis involves making a digital or current measurement at test points while communicating a test pattern to the SRAM. The electronic system communicates with the SRAM by sending test patterns listed in Table I while, simultaneously, the electronic system gathers data and/or makes electrical measurements at the test points listed in Table I. The type of data and/or electrical measurements gathered by the electronic system is listed under the "Test mode" column in Table I. The test pattern will indicate whether one of the faults listed under the associated "Diagnosed faults" column of Table I has occurred. As would be understood, the test patterns provided in Table I are specific to the implementation of the modeled SRAM cell shown in FIG. 4 and FIG. 5. A different implementation on an SRAM cell having a different layout may utilize a different set of test patterns.

The algorithm provided in Table I cannot distinguish electrically equivalent faults. Electrically equivalent shorts are denoted as short groups (SG) in Table I. The faults that compose each short group are noted in Table II. As would be understood, the set of short groups provided in Table II is specific to the described implementation, and may differ for other SRAM layouts or if other wearout mechanisms are considered.

Using the first line of Table I as an example, in the described implementation, the electronic system would measure current at the bitlines of the faulty cell while sending the test pattern to that cell, where the test pattern writes a "1" bit (w1), reads the bit (r1, where "1" is expected), writes a "0" bit (w0), reads the bit (r0, where "0" is expected), then repeats once more to make the pattern w1, r1, w0, r0, w1, r1, w0, r0. Then the electronic system would potentially attribute the cell fault to one of several cell faults: O2-O7, G1, B7, B8, or one of the faults identified by short groups SG1-SG4 listed in Table II.

TABLE I

TEST MODES AND PATTERNS

| Test mode | Test point | Test patterns | Diagnosed faults |
|---|---|---|---|
| Current | Bitlines | (w1, r1, w0, r0) × 2 | O2-O7, SG1-SG4, G1, B7, B8 |
| Digital | Bitlines | (w1, w0) | B7 |
| Current | VDD | (w1, r1) | SG1 |
| Current | VDD | (w0, r0) | SG2 |
| Current | GND | (w1, r1) | SG3 |
| Current | GND | (w0, r0) | G1 |
| Digital | Bitlines | (w1, w0, r0) | B8 |
| Current | Bitlines | (w1, w0, r0) | O4, O5 |
| Current | Bitlines | (w1, w0, pre[1.2 V], r0) | O4 v O5 |
| Current | Bitlines | (w0, w1, r1) | O2, O3 |
| Current | Bitlines | (w0, w1, pre[1.2 V], r1) | O2 v O3 |
| Digital | Bitlines | (w1, w0, r0) | O6, O7 |
| Digital | Bitlines | (w1, w0, pre[1.2 V], r0) | SG4 |
| Digital | Bitlines | (w1, w0, pre[1.2 V], r0) | O1, O11 |
| Digital | Bitlines | (w1, w0, pre[0 V], r0) | O1 v O11 |
| Digital | Bitlines | (w1, w0, pre[0 V – 20 ns], r0) | O8, O9 |
| Digital | Bitlines | (w0, w1, pre[0 V – 20 ns], r1) | O10 |
| Digital | Bitlines | (w1, w0, pre[0 V – access on], r0) | NBTI2, PBTI1, 3, 4 |
| Digital | Bitlines | (w0, w1, pre[0 V – access on], r1) | NBTI1, PBTI2, NBTI2 v PBTI3, PBTI1 v PBTI4 |

TABLE II

FAULT GROUPS FOR RESISTIVE SHORT FAULTS

| Short Group | GOBD | BTDDB |
|---|---|---|
| SG 1 | G6 | B6, B7 |
| SG 2 | G8 | B5 |
| SG 3 | G3 | B1 |
| SG 4 | G2, G4, G5, G7 | B2, B3, B4 |

It should be noted that faults from different mechanisms may cause the same electrical symptoms. Specifically, both EM and SIV may cause resistive opens in the same locations and GOBD and BTDDB may cause resistive shorts in the same locations. The resistive open defects for O2, O5, and O9 due to EM and SIV may create the same electrical failure signature. The equivalent open groups due to EM and SIV for the described implementation are summarized in Table III. As would be understood, the set of open groups provided in Table III is specific to the described implementation, and may differ for other SRAM layouts or if other wearout mechanisms are considered.

Expected failure rates can be used to attribute a bit failure to the most likely wearout mechanism. Using the described implementation as an example, if the electrical measurements made during a test pattern indicates that the fault could be due to one of two wearout mechanisms, the fault may be classified as the wearout mechanism that is expected to be most likely. The expected failure rates may be determined through simulation, reliability test data, or data collected from prior failures during operation, for example.

TABLE III

FAULT GROUPS AND INDICES FOR RESISTIVE OPEN FAULTS

| Open Group | EM | SIV |
| --- | --- | --- |
| OG 1 (m = 1) | O2_EM | O2_SIV |
| OG 2 (m = 2) | O5_EM | O5_SIV |
| OG 3 (m = 3) | O9_EM | O9_SIV |

Figure 6:
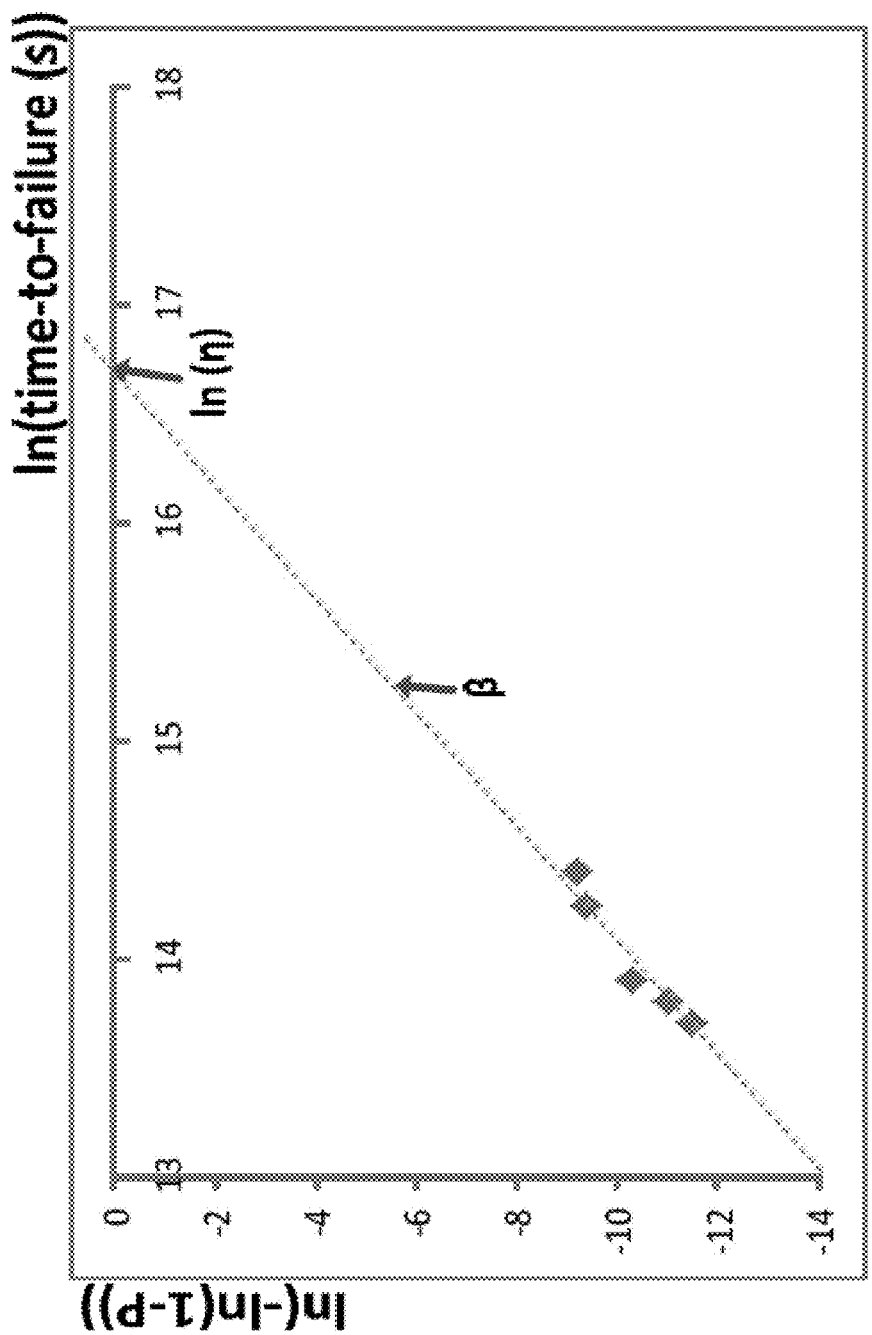
FIG. 6 shows an extraction of Weibull parameters for the failure rate of memory cells by counting the number of failed cells according to an implementation of an example embodiment.

Using the described implementation as an example, and considering an example embodiment following the steps shown in FIG. 3A, and an example embodiment of the electronic system having the components shown in FIG. 3B, faults are detected in SRAM cells 310 and classified according to wearout mechanism 315. The time to failure of SRAM cells due to a given wearout mechanism may be modeled with a statistical distribution, where the statistical distribution is characterized by parameters appropriate for the type of statistical distribution. For example, in the case of a Weibull distribution, the characteristic lifetime, $\eta$, and the shape parameter, $\beta$ are used to model the time to failure. If there are N memory cells in the memory, then the first failure is associated with probability $1/2N$, the second failure is associated with probability $3/2N$, etc. If we record the time to failure, $t_1$ for the first failure, $t_2$ for the second failure, etc., then, with only a few failures, we can solve for the Weibull distribution parameters for the time-to-failure of the memory cells. Specifically, if we plot the ordered pairs $$\left(\ln(t_1), \ln\left(-\ln\left(1 - \frac{1}{2N}\right)\right)\right), \left(\ln(t_2), \ln\left(-\ln\left(1 - \frac{3}{2N}\right)\right)\right), \text{etc.,} \quad \text{(Equation 6)}$$

and use the data to extract a linear equation, the x-intercept is $\ln(\eta)$ and the slope is $\beta$, as illustrated in FIG. 6. Hence, from just determining the time-to-failure due to a given wearout mechanism of a few sample cells in the memory, we can estimate the parameters of the time-to-failure of all memory cells due to that wearout mechanism 320. As would be understood, the distribution and parameters are specific to the wearout mechanism being modeled, and the Weibull distribution described is merely an example provided for illustration.

Note that these are the parameters for the memory cells, and not for the manufacturing process. However, circuitry within the electronic system 340 may store maps that correlate expected failure rates due to a given wearout mechanism in the memory to expected time to failure due to the given wearout mechanism in the integrated circuit. Statistical models of time to failure for the integrated circuit for each wearout mechanism may then be combined to estimate the remaining lifetime of the integrated circuit 330.

Figure 7:
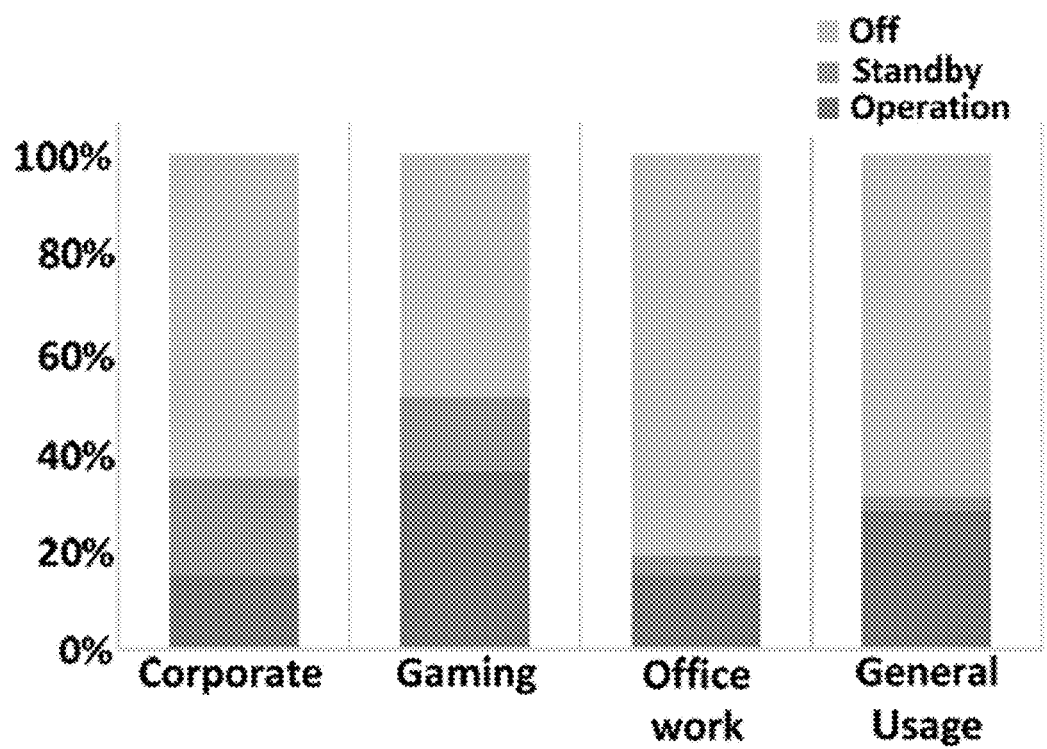
FIG. 7 shows use scenarios according to an example embodiment.

According to example embodiments, use scenarios may be used to estimate the remaining lifetime of the integrated circuit. FIG. 7 shows as examples, the percentage of time that an integrated circuit may be expected to be in "Off", "Standby", or "Operation" modes for four different use scenarios labeled "Corporate", "Gaming", "Office work", and "General Usage." The use scenarios listed here are not intended to be limiting, and additional, fewer or different use conditions could be considered. Use scenarios may also be characterized by different, fewer, or additional modes.

Figures 8A, 8B:
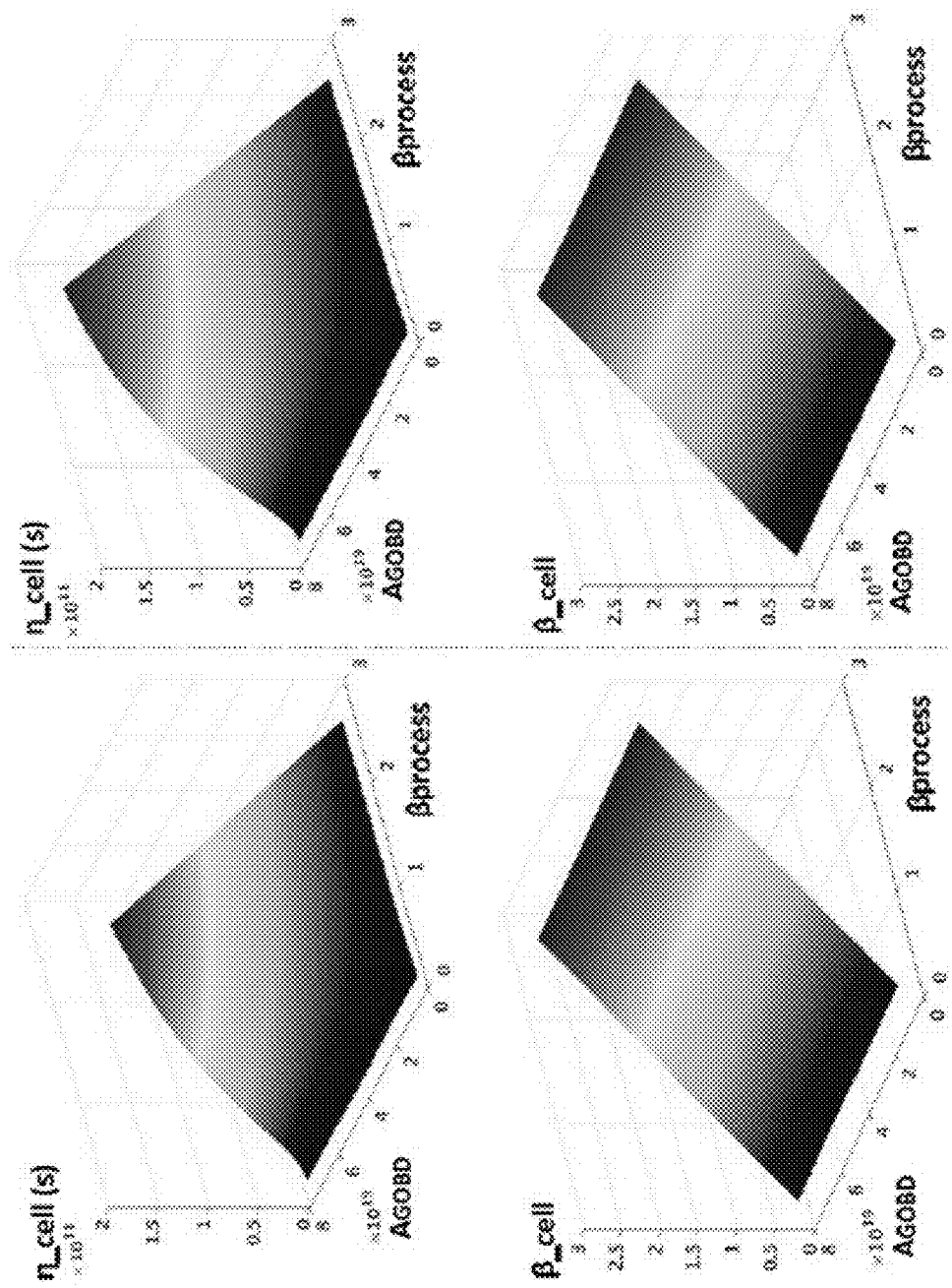
FIGS. 8A and 8B show mapping between integrated circuit wearout parameters and SRAM wearout parameters for the GOBD wearout mechanism according to an implementation of an example embodiment.

Using the described implementation as an example, and considering an example embodiment, FIG. 8A shows mapping functions between integrated circuit wearout parameters and SRAM wearout parameters for the gaming use scenario considering only the GOBD wearout mechanism, and FIG. 8B shows mapping functions between integrated circuit wearout parameters and SRAM wearout parameters for the general use scenario considering only the GOBD wearout mechanism. The mapping functions shown in FIG. 8A and FIG. 8B represent a forward mapping from process parameters $A_{GOBD}$ and $\beta_{process}$ to the memory cell Weibull parameters $\eta\_cell$ and $\beta\_cell$. The $A_{GOBD}$ constant from Equation 4 was varied for FIG. 8A and FIG. 8B. Process parameters $A_{GOBD}$ and $\beta_{process}$ characterize a statistical model of time to failure of the integrated circuit due to the wearout mechanism GOBD, and the memory cell parameters $\eta\_cell$ and $\beta\_cell$ characterize a statistical model of time to failure of the memory due to the GOBD wearout mechanism.

Figures 9A, 9B:
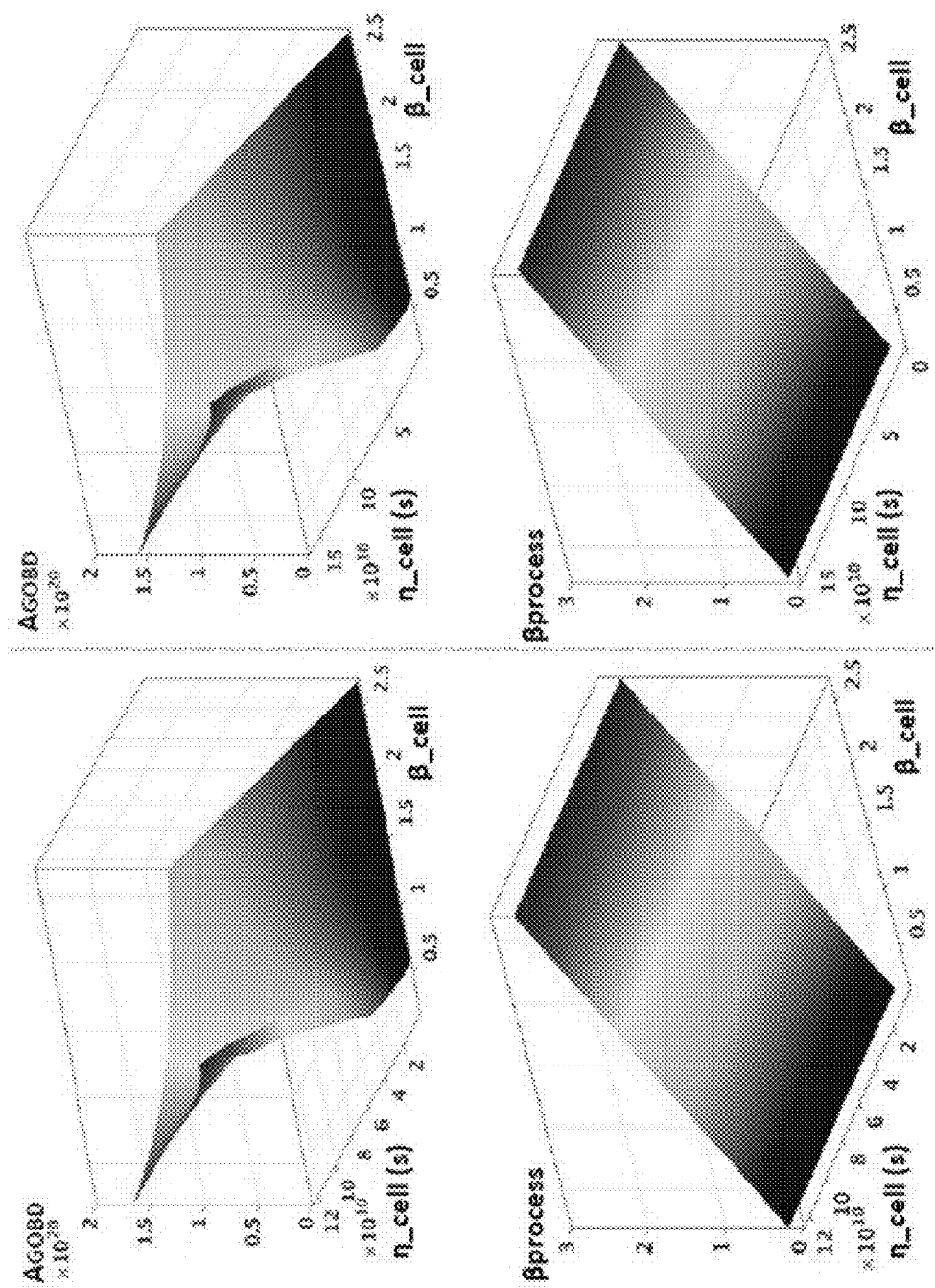
FIGS. 9A and 9B show inverse mapping between integrated circuit wearout parameters and SRAM wearout parameters for the GOBD wearout mechanism according to an implementation of an example embodiment.

FIGS. 9A and 9B show the corresponding inverse maps to FIG. 8A and FIG. 8B. The inverse maps indicate the estimated process-level parameters $A_{GOBD}$ and $\beta_{process}$, given measured data on memory cell Weibull parameters $\eta\_cell$ and $\beta\_cell$. As would be understood, maps and inverse maps may be based upon multiple combinations of wearout mechanisms, use conditions, or other mechanisms or conditions.

Figure 10A:
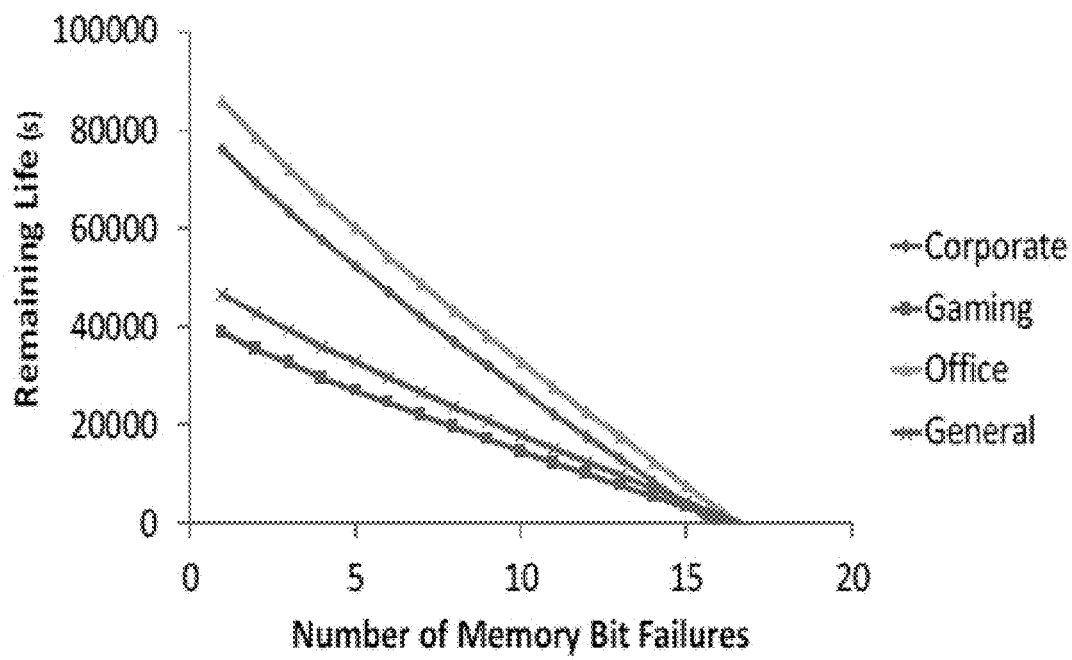
FIGS. 10A and 10B show an example embodiment applied to the LEON3 microprocessor.
Figure 10B:
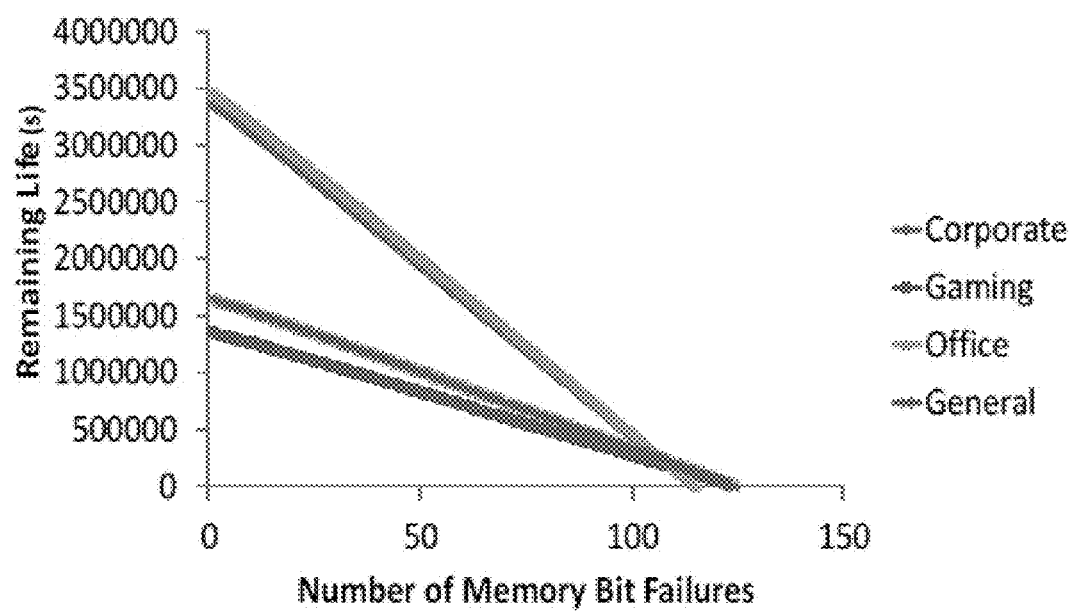

As another example implementation, FIG. 10A and FIG. 10B depicts an example embodiment applied to the LEON3 microprocessor, which contains 94 k bits of error-correcting code memory. One of ordinary skill in the art would understand that almost 100 bits may fail prior to processor failure. One of ordinary skill in the art would understand that the SRAM is a large proportion of the LEON3 chip. The LEON3 microprocessor is vulnerable to a variety of wearout mechanisms including GOBD, BTDDB, and BTI. Therefore, when estimating the remaining lifetime of the LEON3 microprocessor based on memory bit failures, assigning bit failures to wearout mechanisms may significantly improve the accuracy of the lifetime estimation.

To illustrate this point, FIG. 10A and FIG. 10B show simulation results for the remaining lifetime of the LEON3 microprocessor given a number of bit failures, where in FIG. 10A, the bit failures are due to the SIV wearout mode, and in FIG. 10B, the bit failures are due to the EM failure mode. Four use conditions, corporate gaming, office, and general are plotted in FIG. 10A and FIG. 10B. Note that bit failures attributed to SIV (FIG. 10A) indicate a greater reduction in remaining life of the LEON3 microprocessor compared to bit failures attributed to EM (FIG. 10B). Likewise, taking into account use conditions may provide a more accurate estimation of remaining life. FIG. 10A and FIG. 10B show that the LEON3 processor is expected to have a longer life during office use compared to gaming, for example. For the LEON3 microprocessor, the use condition becomes less of a factor as the LEON3 microprocessor approaches end of life.

FIG. 11 illustrates a portion of an electronic system according to an example embodiment. The depicted portion of the system is a reconfigurable BIST implementation platform 1200 including a customized BIST 1205 and test bench 1206. The white boxes in FIG. 11 represent related art BIST system architectures. With the addition of the customized components in grey, the modified BIST system architecture 1200 may be used in one implementation to detect and classify faults into wearout mechanisms or perform other diagnosis on single SRAM system such as the SRAM implementation presented in FIG. 4 and FIG. 5. The electronic system includes a customized controller 1201, a test scheduler 1202, a customized output response analyzer (ORA) 1203, and mux systems 1204. In this embodiment applied to one implementation, the additional custom components 1201, 1202, 1203 allow the BIST platform 1200 to implement test patterns provided in Table I. The BIST controller 1208 may contain the standard test pattern generator (TPG) 1207 and the customized controller 1201. The standard TPG 1207 may create the test patterns for address and read/write data for a standard test algorithm, such as the March algorithm for production test. The customized controller 1201 may contain the register-type circuits to generate the specific test patterns in Table I. The customized output response analyzer (ORA) 1203 may be embedding into the Analyzer 1209 with the built-in repair analysis (BIRA) module. In one implementation of an example embodiment, using the test results from the circuit under test, the customized logic in the ORA 1203 may determine the wearout mechanisms causing failures with the algorithm in Table I. The standard BIRA module 1210 may be used when there is a need to execute standard test algorithms.

Since address sizes and input and output (I/O) widths are not the same for all different types of memories, there is an advantage to design mux systems 1204 in the BIST system wrapper 1205 between the BIST controller 1208 and each test memory 1212 to match the sizes of address and I/O widths. In one implementation of an example embodiment, the test scheduler 1202 may use the user bit registers in the TAP controller 1211 to set the test schedule for each test step in Table I.

Figure 12:
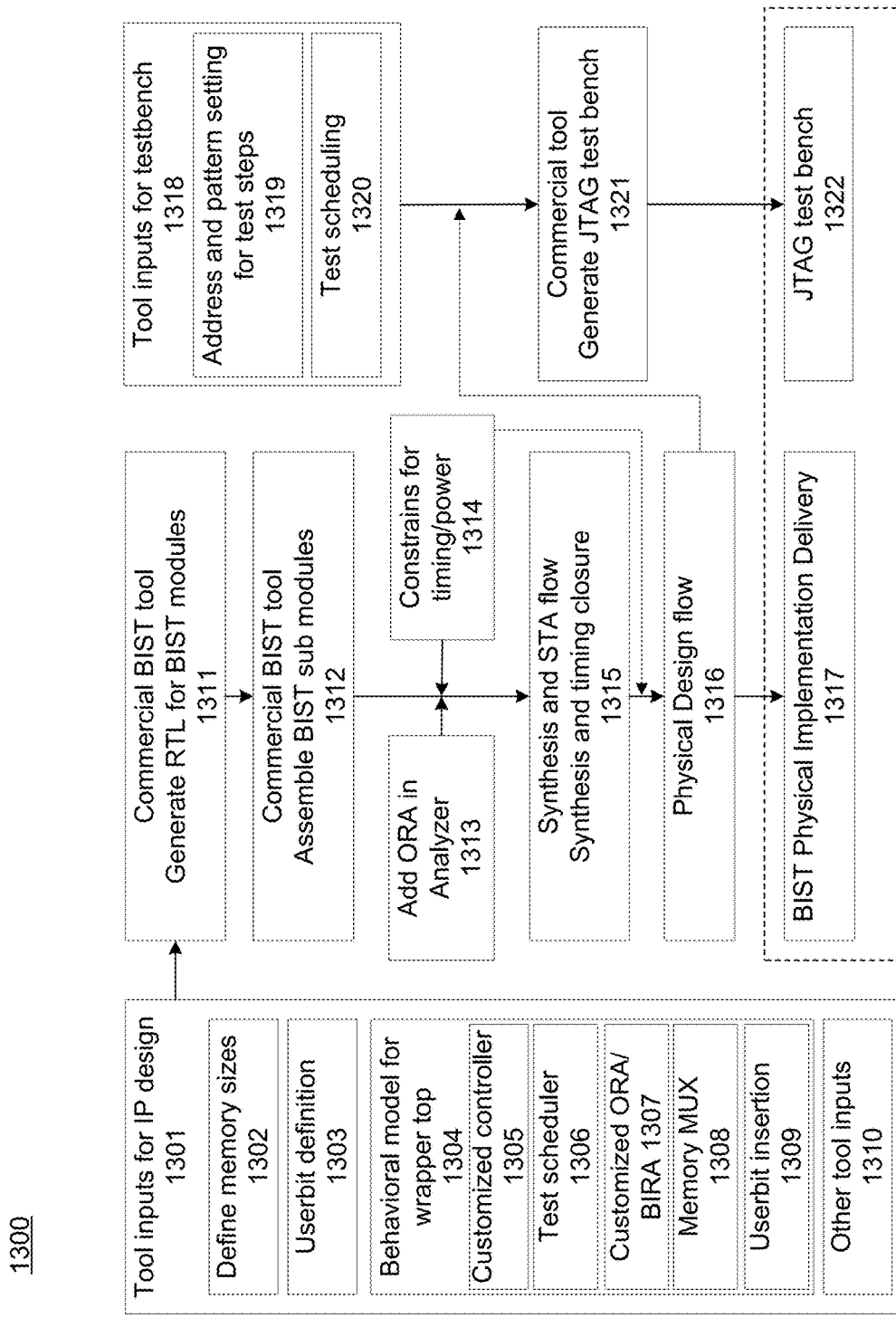
FIG. 12 shows a flow to create a portion of an example embodiment of the electronic system for estimating the remaining lifetime of the integrated circuit.

FIG. 12 shows a possible flow for implementing an example embodiment of a portion of the electronic system capable of performing the above-described methods for estimating the remaining lifetime of the integrated circuit 1300. One of ordinary skill in the art would recognize that this flow incorporates the additional features of a portion of the electronic system which include, as non-limiting examples, the customized controller 1201 the test scheduler 1202, the customized output response analyzer (ORA) 1203, and the mux systems 1204. The tool inputs 1301 may include the behavioral models of the top modules in the BIST system wrapper 1304, memory definitions 1302, and user bit definition 1303 for test step selection. The behavioral models for the customized logic for the customized controller 1305, test scheduler 1306, customized ORA/BIRA 1307, userbit insertion 1309, and mux systems 1308 may be included in the BIST system wrapper 1304 and included in the BIST tool inputs 1301. Other tool inputs 1310 may also be included as tool inputs for IP design 1301. With BIST tool inputs 1301, the BIST tool flow 1300 starts. The BIST tool generates register transfer level (RTL) data for BIST modules 1311 and assembles the BIST modules 1312. The BIST tool generates the behavioral models for each top module for the JTAG interface 1213, the TAP controller 1211, the standard TPG 1207, and BIRA 1210. When the behavioral models for sub modules are generated, the behavioral model of ORA may be inserted in the Analyzer block 1313. In some embodiments, the ORA module 1203 may be connected to the sub modules of BRA 1210, if so, it should be added after the BIST sub modules are created 1312. Constraints for timing and power 1314 should also be included at this time. Then, the flow may continue with synthesis 1315 and physical design 1316 given the behavioral models for the top and sub-modules which have the specific design constraints for each application and process technology.

In some implementations, the BIST tool flow (FIG. 12) 1300 may be used to generate the test bench as a JTAG standard for test patterns, for example as provided in an implementation associated with Table I. The tool inputs for generation of the test bench 1318 may be the test pattern for addresses 1319 and data for each test step for each memory size 1320 in Table I. With the specific inputs and the generated BIST physical implementation 1317, the test algorithm in Table I may be converted to a JTAG standard 1321 to create the JTAG test bench 1322. As would be understood, the flow for implementing a customized BIST as applied to this specific implementation may be modified to generate a BIST customized for the specific implementation and is not limited to specifics of the described flow.

In the present disclosure, where a document, an act and/or an item of knowledge is referred to and/or discussed, then such reference and/or discussion is not an admission that the document, the act and/or the item of knowledge and/or any combination thereof was at the priority date, publicly available, known to the public, part of common general knowledge and/or otherwise constitutes prior art under the applicable statutory provision; and/or is known to be relevant to an attempt to solve any problem with which the present disclosure may be concerned with. Further, nothing is disclaimed.

The invention claimed is:

1. A processor-implemented method for estimating a remaining lifetime of an electronic integrated circuit where the electronic integrated circuit includes memory, the method comprising:
   performing a diagnostic on a fault in the memory;
   generating, based on the performed diagnostic, a statistical model of time to failure of the memory;
   generating, based on the statistical model of time to failure of the memory, a statistical model of time to failure of the electronic integrated circuit; and
   estimating, based on the statistical model of time to failure of the electronic integrated circuit, the remaining lifetime of the electronic integrated circuit;
   wherein at least one of the statistical model of time to failure of the memory and the statistical model of time to failure of the electronic integrated circuit is a Weibull distribution.

2. The method of claim 1, wherein the electronic integrated circuit is one of a microprocessor, microcontroller, or a system on a chip (SoC).

3. The method of claim 1 further comprising diagnosing the cause of the fault in the memory.

4. The method of claim 1, wherein estimating the remaining lifetime of the electronic integrated circuit is further based on use scenarios.

5. The method of claim 3, wherein diagnosing the cause of the fault in the memory comprises using one or more of the following:
   a paired comparison between cells in an upper bank and a lower bank in a same sector of the memory to analyze bitline current of the memory;
   error-correcting code data; and
   a built-in self test (BIST) system.

6. The method of claim 1, wherein performing a diagnostic on a fault in the memory comprises one or more of:
   analyzing data related to one or more memory cell failures; and
   analyzing data related to time between two or more memory cell failures.

7. The method of claim 1, wherein performing a diagnostic on a fault in the memory comprises one or more of:
   determining the number of memory cell failures; and
   determining the time between memory cell failures.

8. The method of claim 1, wherein performing a diagnostic on a fault in the memory comprises determining the number of memory cell failures.

9. The method of claim 8 further comprising diagnosing the cause of at least one of the memory cell failures.

10. A processor-implemented method for estimating a remaining lifetime of an electronic integrated circuit where the electronic integrated circuit includes a circuit block comprising redundant circuitry, the method comprising:
detecting a fault in the circuit block comprising redundant circuitry;
classifying the fault into a wearout mechanism;
generating, based on the classification of the fault, a statistical model of time to failure of the circuit block comprising redundant circuitry containing the fault;
generating, based on the statistical model of time to failure of the circuit block comprising redundant circuitry containing the fault, a statistical model of time to failure of the electronic integrated circuit; and
estimating, based on the statistical model of time to failure of the electronic integrated circuit, the remaining lifetime of the electronic integrated circuit.

11. The method of claim 10, wherein estimating the remaining lifetime of the electronic integrated circuit is further based on use scenarios.

12. The method of claim 10, wherein the wearout mechanisms is selected from the group consisting of backend dielectric breakdown (BTDDB), gate oxide breakdown (GOBD), electromigration (EM), stress-induced voiding (SIV), hot carrier injection (HCI), time-dependent gate oxide breakdown (GTDDB), middle-of-line time-dependent dielectric breakdown (MTDDB), negative bias temperature instability (NBTI), and positive bias temperature instability (PBTI).

13. The method of claim 10, wherein classifying of the fault into the wearout mechanism comprises determining a location of the fault.

14. The method of claim 10, wherein classifying of the fault into the wearout mechanism comprises providing an electrical signal to the circuit block comprising redundant circuitry containing the fault and monitoring an electrical test point within the circuit block comprising redundant circuitry containing the fault.

15. The method of claim 10, wherein the classifying of the fault into the wearout mechanism is based at least in part on expected failure rates due to the wearout mechanism in the circuit block comprising redundant circuitry containing the fault.

16. The method of claim 10, wherein:
the electronic integrated circuit includes one or more circuit blocks comprising redundant circuitry;
detecting a fault comprises detecting a fault in one of the one or more circuit blocks comprising redundant circuitry;
classifying the fault comprises classifying the fault into one or more wearout mechanisms based at least in part on expected failure rates due to one or more of the wearout mechanisms in the circuit block comprising redundant circuitry containing the fault;
generating, based on the classification of the fault, a statistical model of time to failure comprises generating, based on the classification of the fault, a statistical model of time to failure of the one or more circuit blocks comprising redundant circuitry containing the fault;
generating, based on the statistical model of time to failure comprises generating, based on the statistical model of time to failure of the one or more circuit blocks comprising redundant circuitry containing the fault, a statistical model of time to failure of the electronic integrated circuit;
estimating the remaining lifetime of the electronic integrated circuit is further based on use scenarios;
each wearout mechanism is selected from the group consisting of backend dielectric breakdown (BTDDB), gate oxide breakdown (GOBD), electromigration (EM), stress-induced voiding (SIV), hot carrier injection (HCI), time-dependent gate oxide breakdown (GTDDB), middle-of-line time-dependent dielectric breakdown (MTDDB), negative bias temperature instability (NBTI), and positive bias temperature instability (PBTI); and
detecting the fault comprises using one or more of the following:
error-correcting code data; and
providing one or more electrical signals to the circuit block comprising redundant circuitry containing faults and monitoring one or more electrical test points within the circuit block comprising redundant circuitry containing the fault.

17. An electronic system in communication with a memory, wherein an electronic integrated circuit is comprised at least in part of the memory, the electronic system comprising:
a controller;
a test pattern generator; and
an output response analyzer;
wherein the electronic system is configured to estimate a remaining lifetime of the electronic integrated circuit by:
performing a diagnostic on a fault in the memory;
generating, based on the performed diagnostic, a statistical model of time to failure of the memory;
generating, based on the statistical model of time to failure of the memory, a statistical model of time to failure of the electronic integrated circuit; and
estimating, based on the statistical model of time to failure of the electronic integrated circuit, the remaining lifetime of the electronic integrated circuit; and
wherein performing a diagnostic on a fault in the memory comprises one or more of:
determining the number of memory cell failures; and
determining the time between memory cell failures.

18. The electronic system of claim 17 further comprising diagnosing the cause of the fault in the memory using one or more of the following:
a paired comparison between cells in an upper bank and a lower bank in a same sector of the memory to analyze bitline current of the memory; and
error-correcting code data.

19. The electronic system of claim 17, wherein the diagnostic is further configured to distinguish the failure due to each wearout mechanism.

20. The electronic system of claim 19, wherein performing the diagnostic on the memory comprises communicating a sequence of read and write commands to the memory.

21. A method for updating a physical model of a wearout mechanism comprising:
detecting a fault in a circuit block containing redundant circuitry;
providing one or more electrical signals to the circuit block containing redundant circuitry containing the fault;

monitoring one or more electrical test points within the circuit block containing redundant circuitry containing the fault, wherein the one or more electrical test points provide an output in response to the providing of the one or more electrical signals;

classifying, based on the monitoring of the one or more electrical test points proving the output, the fault into one of a plurality of wearout mechanisms;

recording the wearout mechanism in which the fault was classified and a time to failure of the fault; and transmitting the recorded wearout mechanism and the time to failure of the fault wherein the transmitted wearout mechanism and the time to failure of the fault is used to update the physical model of the wearout mechanism in which the fault is classified.

22. The method of claim 21, wherein transmitting of the recorded wearout mechanism and time to failure of the fault is used to update values of one or more fitting parameters, one or more constants, or at least one fitting parameter and at least one constant of the physical model of the wearout mechanism in which the fault is classified.

23. The method of claim 21, further comprising generating, based on the updated statistical model of the wearout mechanism, a statistical model of time to failure of a second circuit block included in a second electronic integrated circuit;

wherein a first electronic integrated circuit includes the circuit block containing redundant circuitry.

* * * * *